United States Patent [19]

Daberkoe

[11] Patent Number: 4,489,365

[45] Date of Patent: Dec. 18, 1984

[54] UNIVERSAL LEADLESS CHIP CARRIER MOUNTING PAD

[75] Inventor: David P. Daberkoe, Exton, Pa.

[73] Assignee: Burroughs Corporation, Detroit, Mich.

[21] Appl. No.: 419,235

[22] Filed: Sep. 17, 1982

[51] Int. Cl.³ ............................................. H05K 1/02
[52] U.S. Cl. ................................. 361/403; 174/68.5; 361/406; 361/409
[58] Field of Search ...................... 361/403, 406, 409; 174/68.5

[56] References Cited

U.S. PATENT DOCUMENTS 3,716,761  2/1973  Rotast ................................. 361/409
4,195,195  3/1980  Miranda et al. ................. 361/406 X
4,326,239  4/1982  Ohsawa et al. ................... 174/112 X Primary Examiner—R. R. Kucia
Attorney, Agent, or Firm—F. A. Varallo; M. L. Young; K. R. Peterson

[57] ABSTRACT

The present disclosure describes a universal leadless chip carrier mounting pad layout for an interconnection medium such as a printed circuit board, which accommodates a wide range of chip carrier sizes. Thus, there is eliminated the traditional method of providing custom pad layouts homologously configured as to numbers of pads and their arrangement, in specific chip carriers. The universality of the present pad layout makes it especially desirable for prototype designs, and integrated circuit chip "burn in" and test procedures.

7 Claims, 7 Drawing Figures

UNIVERSAL LEADLESS CHIP CARRIER MOUNTING PAD

BACKGROUND OF THE INVENTION

A chip carrier mounting pad or "footprint" may be defined as the metallized artwork leads on an interconnection medium such as a printed circuit board to which a leadless chip carrier may be soldered or otherwise mounted. Traditionally, each size leadless chip carrier, having for example, numbers of pads or terminals ranging from 16 to 128, requires its own custom footprint corresponding precisely to the number and pad configuration. Because of this, interchangeability of leadless chip carriers can only occur if the same size carrier package is used. Thus, a 20 pad carrier cannot be mounted on a 16 lead footprint. This arrangement takes away a certain degree of freedom, particularly in circuit design where changes frequently occur. Additionally, during the "burn in" and test of integrated circuit chips, an interconnection medium must be provided having the full range of custom footprints corresponding to the respective carriers.

It is apparent that what is needed is a universal pad layout or footprint, which will accommodate a wide range of leadless chip carrier sizes. The present invention provides such a layout.

SUMMARY OF THE INVENTION

In accordance with the present invention, there is provided a mounting pad or footprint having a unique configuration of metallized leads which can accommodate a wide range of sizes of leadless chip carrier packages. The pad configuration is expanded to include the largest size package which is to be utilized.

In forming the universal footprint of the present invention, a central rectangular area is provided on the printed circuit board which is devoid of printed leads. This area is encompassed by sixteen parallel, spaced-apart leads uniformly arranged in four groups of four leads each situated on the respective sides thereof. The tips of the last mentioned leads terminate on the perimeter of the rectangle, but do not contact each other. Accordingly, the tips of the four leads in any given group lie in a common plane.

Further, to a first group of four leads, an additional lead is added in parallel with, but spaced apart from each of the outermost leads thereof. The tips of the added leads also lie in the same plane as those of the first group. To each of the second and third groups of four leads which lie adjacent to, and are oriented at right angles to those of the first group, a single lead is added alongside the outermost lead furthest removed from the leads of the first group. The tip of each added lead lies in the common plane of the group with which it is associated. The fourth group of leads which is located opposite to those of the first group are unaffected. At this point, the pad configuration includes six leads in the first group, five leads in each of the second and third groups and four leads in the fourth group.

Next, successive pairs of "staggered" leads are added uniformly to all of the groups of leads. These pairs of staggered leads are disposed respectively alongside the outermost leads in each group, and the lead tips of each pair lie in a common plane parallel to, but displaced a fixed distance from the plane in which the preceding lead tips of the group are situated. The actual displacements of corresponding pairs of tips for all of the groups is the same. Staggered leads in adjacent groups approach one another at right angles but avoid contact.

The successive addition of staggered pairs of leads uniformly to all of the groups results in a continued expansion of the original groups, enabling the mounting of leadless chip carrier packages of increasing size. As to the length of the individual leads or pads, the pad tails are extended beyond the outside of the largest package intended for use at that location. After being carefully positioned on the footprint, the package pads are affixed to the leads, such as by a reflow soldering process. Terminals, wire wrap pins or direct soldering techniques may be employed to connect the leads of the footprint to other media.

Other features and advantages of the present invention will become apparent in the detailed description of the invention which follows.

DESCRIPTION OF THE PREFERRED EMBODIMENT

Figure 1:
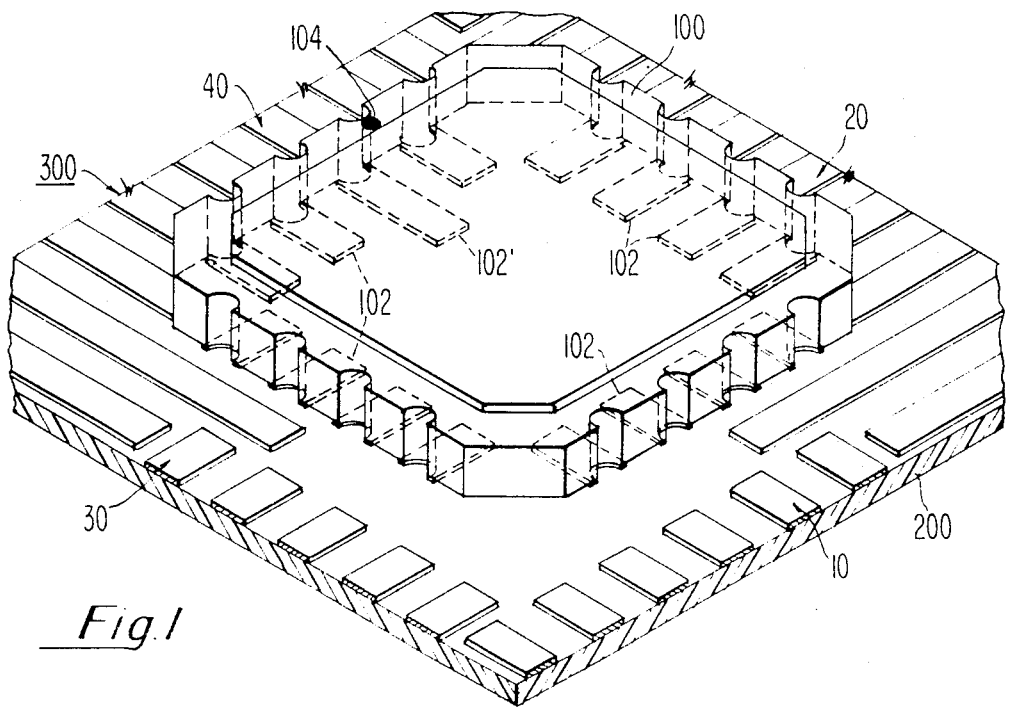
FIG. 1 is an exploded view depicting the relationship of a typical leadless chip carrier to a printed circuit board bearing the universal mounting pad of the present invention.

FIG. 1 illustrates in exploded fashion, a leadless chip carrier 100 having a total of sixteen pads 102, four pads on each side; and a printed circuit board 200 bearing the universal mounting pad 300 comprised of an arrangement of electrically conductive groups of leads 10, 20, 30 and 40, to be described hereinafter. One of the pads 102' on the carrier is elongated to serve as an "identifier" for the electrical circuit of the chip (not shown) and for convenience, a mark 104, may be placed on the outer surface of the carrier package directly above the identifier.

Figure 2:
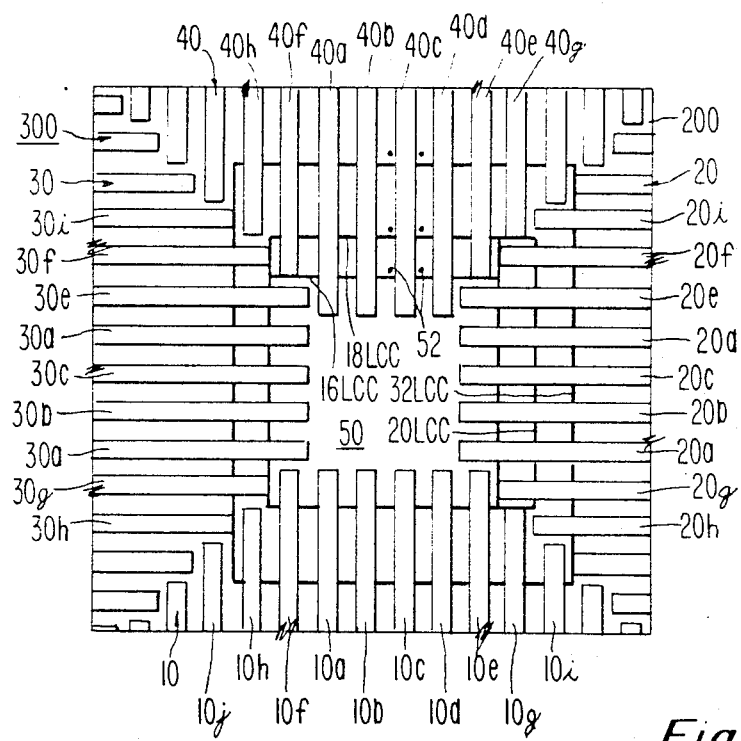
FIG. 2 illustrates the universal mounting pad of the present invention.

FIG. 2 illustrates the universal mounting pad or footprint 300 of the present invention as it appears on the surface of a printed circuit board 200.

The universal footprint 300 is formed by providing a central rectangular area 50 devoid of metallized leads. This area is encompassed by sixteen parallel, spaced-apart leads, arranged in four groups, 10, 20, 30 and 40, each identified respectively as 10a–10d, 20a–20d, 30a–30d and 40a–40d, each group being inclusive. The tips of the last mentioned leads terminate on the perimeter of the rectangular area 50.

Two additional leads, 10e and 10f are added to the "10" group of leads, and the tips of all of the six leads 10a through 10f lie in a common plane. Lead 20e is added to the "20" group of leads, while 30e is added to the "30" group of leads. The five lead tips 20a–20e inclusive as well as the five tips 30a–30e inclusive lie in respective common planes.

A first pair of staggered leads is then added to each of the groups 10 through 40. For example, leads 10g and 10h are added to the "10" group, 20f and 20g to the "20" group, 30f and 30g to the "30" group, and 40e and 40f to the "40" group. The tips of each of the last mentioned pairs of staggered leads lie in a common plane, parallel to, but displaced a fixed distance from the plane in which the preceding lead tips of the group to which they belong are situated. The same is true of successive pairs of staggered leads. For example, the tips of leads 10i and 10j lie in a plane displaced by said fixed distance from that of the tips of 10g and 10h.

Electrically non-conductive markings are placed on the surface of the printed circuit board 200 corresponding to the outlines of the leadless chip carrier packages to be mounted on the universal mounting pad 300. The reference designations 16LCC, 18LCC and 20LCC for the 16, 18 and 20 pad (terminal) leadless chip carrier packages respectively have been placed on the non-common sections of the outlines of these packages. Similarly, 32 LCC designates a 32 pad package. The purpose of the outlines is to serve as a reference for insuring that the chip carrier pads 102 (FIG. 1) will be properly registered with the leads 10–40 inclusive of the universal footprint 300. Additionally, lead 40c has been marked with dots 52 to insure that the carrier package "identifier" pad 102' (FIG. 1) will contact the last mentioned lead.

Figure 3:
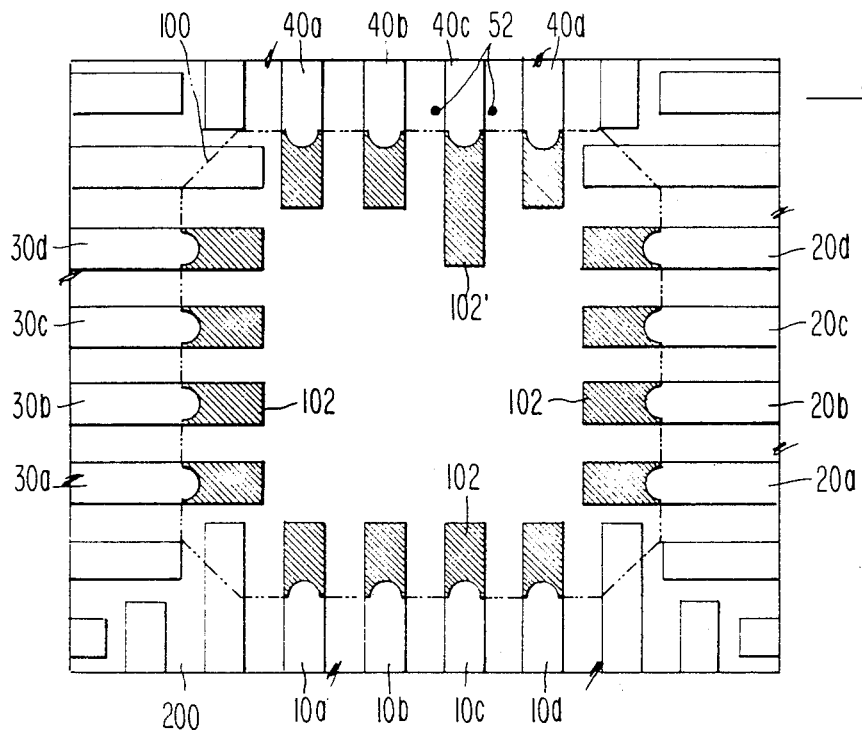
FIGS. 3, 4, 5 and 6 illustrate respective representative applications of the universal mounting pad of FIG. 2 wherein leadless chip carriers having respectively 16, 18, 20 and 32 pads are shown mounted thereon.

In FIG. 3, the chip carrier package 100 is depicted in phantom to better illustrate the contact of its sixteen pads 102 (shown crosshatched) with leads 10a–10d, 20a–20d, 30a–30d and 40a–40d, each group inclusive.

Figure 4:
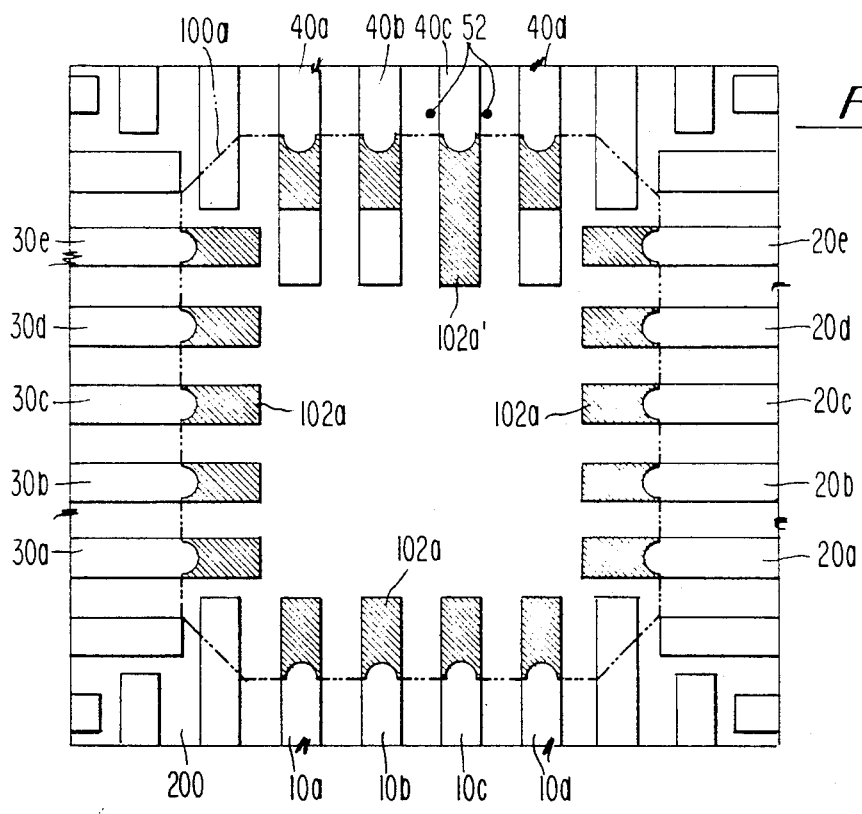

FIG. 4 illustrates a chip carrier package 100a with eighteen pads 102a in contact with leads 10a–10d, 20a–20e, 30a–30e, and 40a–40d, each group inclusive.

Figure 5:
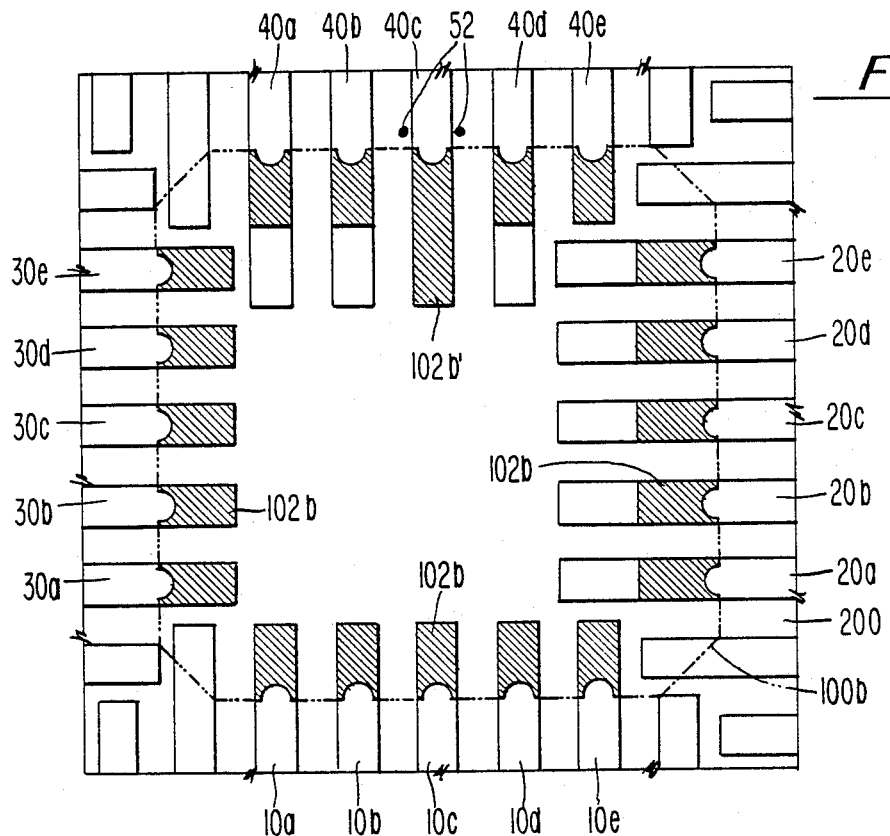

FIG. 5 illustrates a chip carrier package 100b with 20 pads 102b in contact with leads 10a–10e, 20a–20e, 30a–30e and 40a–40e, each group of leads inclusive.

Figure 6:
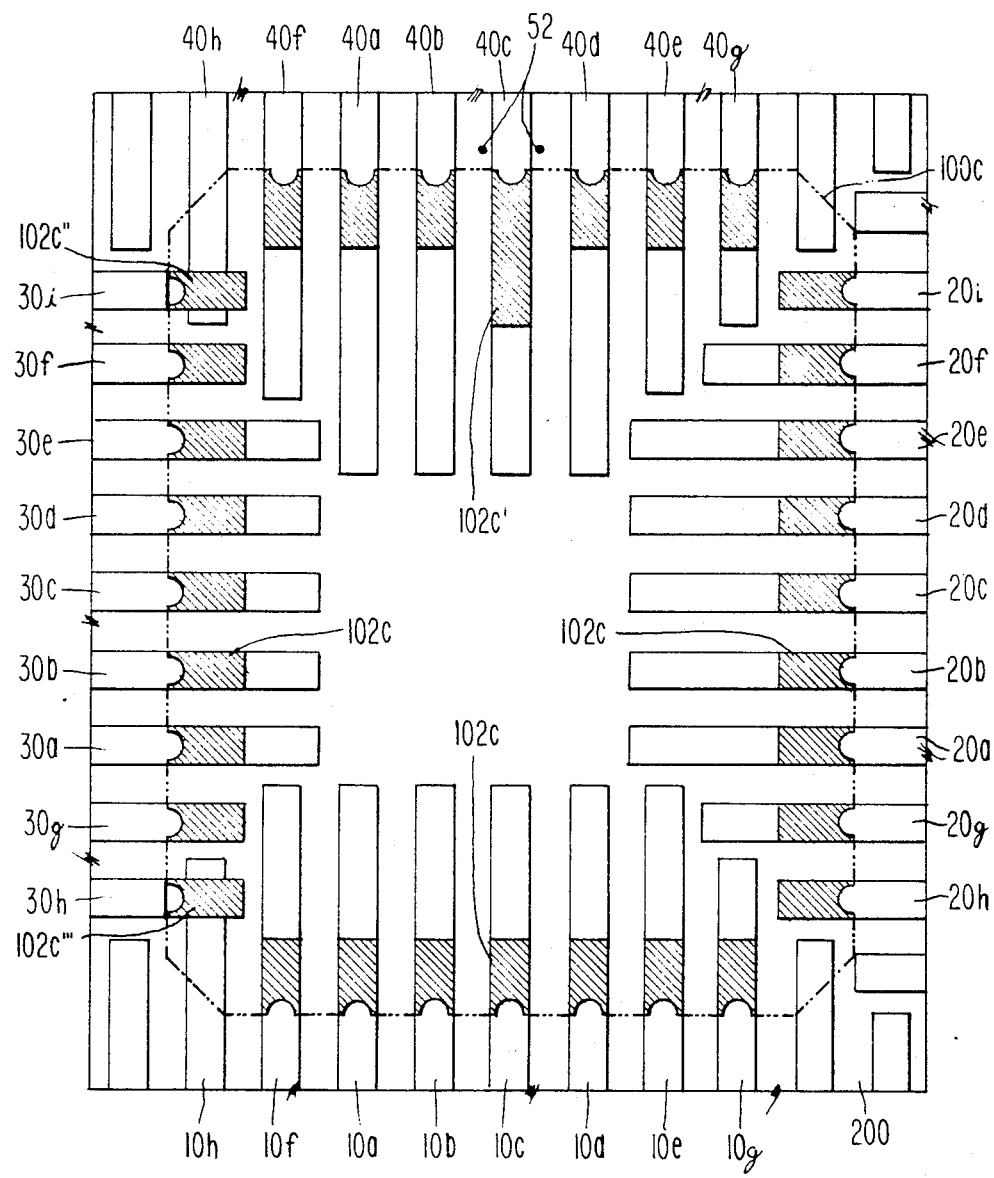

FIG. 6 illustrates a chip carrier package 100c with 32 pads 102c in contact with leads 10a–10h, 20a–20i, 30a–30g and 40a–40h, each group inclusive. It should be noted that pads 102c'''' and 102c''' on the left side of carrier 100c contact leads 10h and 40h respectively at the bottom and top of the universal pad respectively, but not leads 30h and 30i, as seen in FIG. 6.

Figure 7:
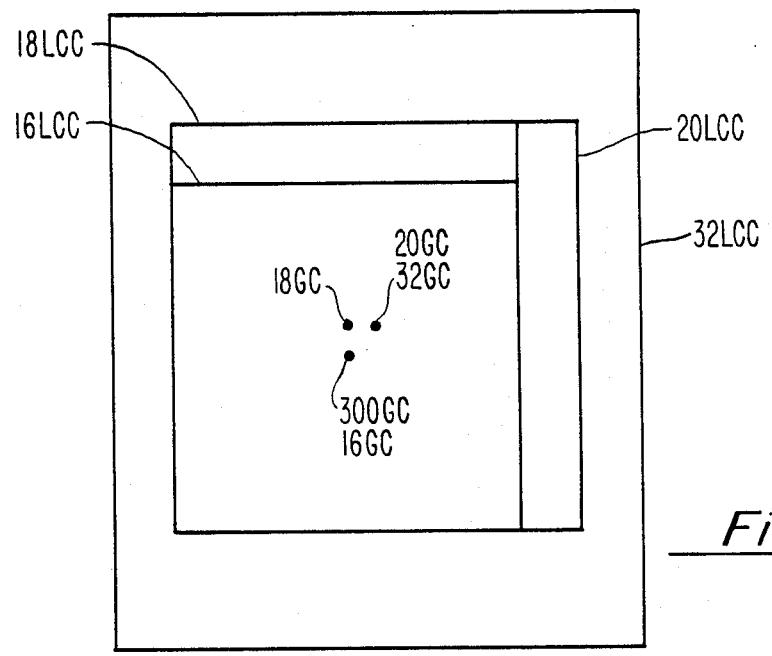
FIG. 7 depicts the relationship of the geometrical center of the universal mounting pad to the geometrical centers of the respective leadless chip carriers depicted in FIGS. 3 through 6 inclusive.

FIG. 7 illustrates the relationship of the geometrical center 300GC of the universal mounting pad with the geometrical centers 16GC, 18GC, 20GC and 32GC of the mounted 16, 18, 20 and 32 pad packages respectively, chosen for purposes of example. The outlines of the last mentioned packages, as they appear respectively on the interconnection medium (FIG. 2), are designated 16LCC, 18LCC, 20LCC on the side not common to the other packages, and 32LCC for the largest package. In general, packages with even numbers of pads on all four sides, such as 16 pad packages, have their geometrical centers coincident with that of the mounting pad, while packages with odd numbers of pads on all four sides, such as 20 and 32, have their geometrical centers angularly displaced (45°) from the geometrical center 300GC of the mounting pad. The 18 pad package differs from the others in that it has even numbers of pads on two sides, and odd numbers of pads on the other two sides. The geometrical center of this package is displaced in a vertical direction from 300GC. Thus, the geometrical centers of all of the packages lie on the vertices of a right triangle as seen in FIG. 7.

It should be noted that all of the packages have been placed on the mounting pad with the "identifier" pad in contact with lead 40c. Other arrangements are possible at the discretion of the designer. Also, in particular applications, changes and modifications of the pad layout may be required. Such changes and modifications, insofar as they are not departures from the true scope of the invention, are intended to be covered by the claims which follow.

What is claimed is:

1. A universal mounting pad layout of electrically conductive leads for accepting leadless chip carriers of different sizes comprising:

an interconnection medium for supporting said universal mounting pad and having a central rectangular area devoid of said leads, said leads encompassing said area and being arranged in groups associated respectively with the sides of said rectangular area, the leads in each of said groups having their longitudinal axes oriented at right angles to the plane of the area side with which they are associated, the homologous leads in each pair of groups disposed on opposite sides of said rectangular area having respective coincident center lines, a like plurality of said leads in each of said groups having their tips oriented in a common plane and terminating on the perimeter of said area, a first of said groups including an additional pair of leads having their tips situated in said common plane with the tips of said like plurality of leads in the last mentioned group, a second and a third of said groups adjacent to said first of said groups each including an additional lead having its tip situated in said common plane with the tips of said like plurality of said leads in one of the last mentioned groups, a fourth of said groups opposite to said first of said groups having the tips of said like plurality of leads situated in said common plane, each of said groups further including successive pairs of said leads configured in a staggered pattern wherein the tips of each of said pairs of said leads lie in a plane parallel to said common plane of said like plurality of said leads in the group with which they are associated, but displaced therefrom by a distance directly proportional to the order of their succession.

2. A universal mounting pad layout as defined in claim 1 further characterized in that said additional pair of leads included in said first of said groups are added in parallel with, but spaced-apart from the respective outermost leads of said like plurality of said leads associated with said first of said groups.

3. A universal mounting pad layout as defined in claim 2 further characterized in that said additional lead included in said second and said third of said groups is added in parallel with, but spaced-apart from the outermost one of said like plurality of said leads associated with said second and said third of said groups, said outermost one of said leads being furthest removed from said like plurality of leads in said first of said groups.

4. A universal mounting pad layout as defined in claim 3 wherein said like plurality of said leads in each of said groups comprises four leads, and said first, second, third and fourth of said groups have the tips of six, five, five and four leads respectively situated in said common plane associated with each of the last mentioned groups.

5. A universal mounting pad layout as defined in claim 4 further including a plurality of electrically nonconductive markings disposed on said layout which correspond to the outline of the respective leadless chip carrier packages desired to be mounted on said layout so as to more precisely locate the package pads with said leads of said layout.

6. A universal mounting pad layout as defined in claim 5 wherein a predetermined one of said leads is marked to serve as a reference lead corresponding to an "identifier" pad on the leadless chip carrier.

7. A universal mounting pad layout as defined in claim 6 further characterized in that the tails of said leads are extended beyond the largest leadless chip carrier package intended for use on said layout.

* * * * *